United States Patent [19]
Bristol

[11] 3,952,269
[45] Apr. 20, 1976

[54] SURFACE ACOUSTIC WAVE DELAY LINE

[75] Inventor: Thomas W. Bristol, Orange, Calif.

[73] Assignee: Hughes Aircraft Company, Culver City, Calif.

[22] Filed: Apr. 28, 1975

[21] Appl. No.: 572,531

[52] U.S. Cl. ............................ 333/30 R; 29/25.35; 310/9.8; 333/72
[51] Int. Cl.² ................... H03H 9/26; H03H 9/30; H03H 9/32; H01L 41/22
[58] Field of Search .............. 333/30 R, 72; 310/8, 310/8.1, 8.2, 8.3, 9.7, 9.8; 29/25.35

[56] References Cited
UNITED STATES PATENTS

| | | | |
|---|---|---|---|
| 3,845,420 | 10/1974 | Holland et al. | 333/30 R |
| 3,882,429 | 5/1975 | Martin | 333/30 R |

OTHER PUBLICATIONS

Fink –"Television Engineering Handbook," McGraw–Hill New York, 1957; p. 15.

Primary Examiner—Alfred E. Smith
Assistant Examiner—Marvin Nussbaum
Attorney, Agent, or Firm—John Holtrichter, Jr.; W. H. MacAllister, Jr.

[57] ABSTRACT

A surface acoustic wave device wherein spaced input and output transducers are disposed on a piezoelectric substrate and wherein a time delay or insertion phase compensation structure is disposed between the transducers in the path of the propagating surface acoustic wave energy, the structure including a group of transversely disposed conductive electrodes initially conductively interconnected outside the propagating energy path whereby a desired time delay or insertion phase may be obtained by electrically insulating a number of the electrodes from the group of initially conductively interconnected electrodes.

8 Claims, 9 Drawing Figures

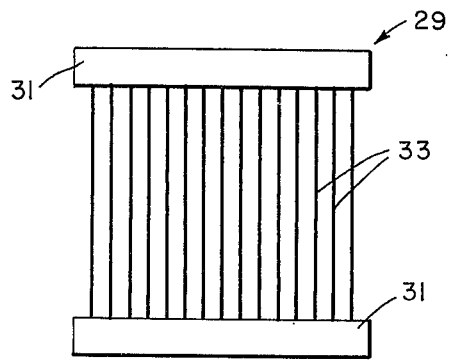
Fig. 3.
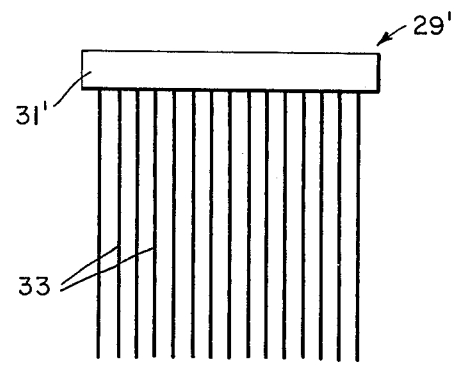
Fig. 4.
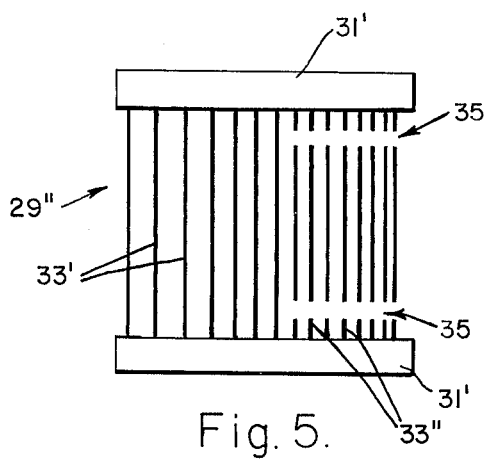
Fig. 5.
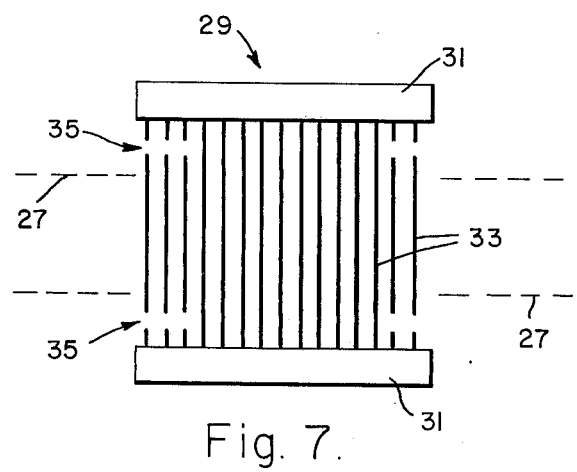
Fig. 7.
Fig. 8.
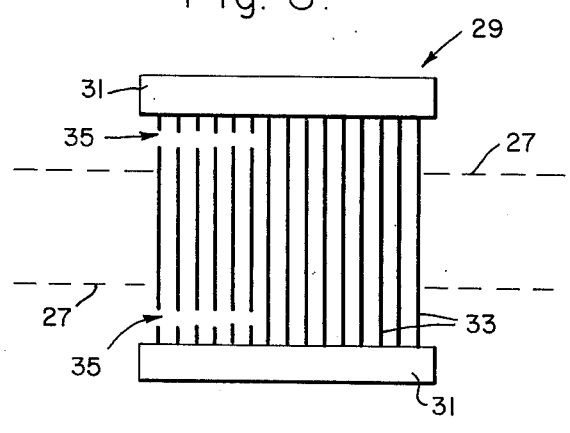
Fig. 9.
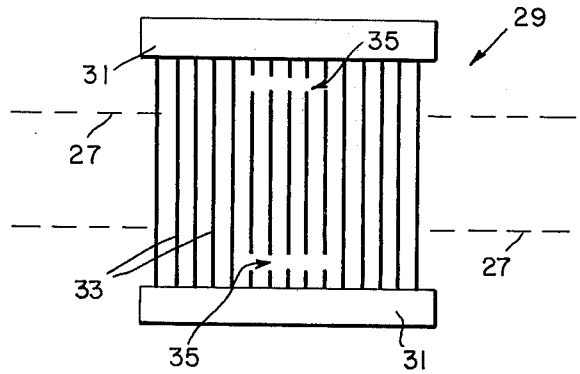

SURFACE ACOUSTIC WAVE DELAY LINE

The invention herein described was made in the course of or under a contract with the United States Navy.

BACKGROUND OF THE INVENTION

The background of the invention will be set forth in two parts.

1. Field of the Invention

This invention relates to surface acoustic wave devices and more particularly to delay lines.

2. Description of the Prior Art

A surface acoustic wave delay line generally comprises a pair of transducers, one input and one output, disposed on a piezoelectric substrate surface capable of supporting surface acoustic wave energy propagating between the transducers. Basically, the time delay or insertion phase provided by the device is governed by the distance between the transducers and the average velocity of the propagating surface wave energy. That is, the longer the distance and/or the lower the velocity, the longer the time delay and the larger the insertion phase.

In the past, it has been difficult, time consuming, and expensive to precisely provide a desired time delay in such devices. For example, in accordance with one prior art technique, the spacing between transducers is modified by either redesigning the photomask and fabricating a new device, or one of the transducers is eradicated and redeposited with a new, shifted position. Another technique is to deposit a continuous metal film of appropriate length to increase (only) the delay. Both techniques require complete disassembly of the delay line and photolithographic processing. These are generally considered to be "last resort" measures because of the high cost of fabrication.

An area in which a precise time delay is highly desirable is that of surface acoustic wave oscillators. Such oscillators consist of an amplifier with a delay line in its feedback path. The frequency of oscillation is a critical function of the time delay which must be typically controlled to within two parts in $10^6$. Currently, frequency adjustments are made by introducing appropriate phase shifts in an external network because the required control cannot be achieved in a conventional delay line.

In fact, there are an ever increasing number of applications of surface acoustic wave delay lines which require precise control of time delay or insertion phase. A few examples of these applications are: time-multiplexing delay lines and multiple correlator filters where extreme time delay accuracy is required. Here, fundamental limitations imposed by such factors as crystal orientation tolerances make it difficult and expensive to achieve the required accuracy, especially when a batch of identical lines are required. It should therefore be evident that a simple, accurate and inexpensive technique that would provide the desired time delay or insertion phase, and that would make it possible to easily compensate for errors in a plurality of identical lines, for example, would constitute a significant advancement in the art.

SUMMARY OF THE INVENTION

In view of the foregoing factors and conditions characteristic of the prior art, it is a primary object of the present invention to provide a new and improved surface acoustic wave delay line.

Another object of the present invention is to provide a simple, effective and inexpensive adjustable surface acoustic wave delay line.

Still another object of the present invention is to provide a surface acoustic wave delay line exhibiting an extremely accurate time delay and insertion phase.

Yet another object of the present invention is to provide a surface acoustic wave delay line that is adjustable over wide time delay and insertion phase ranges.

Still a further object of the present invention is to provide a surface acoustic wave delay line that does not require disassembly of the delay line and photolithographic processing in order to change the delay time or insertion phase.

Yet a further object of the present invention is to provide a new and improved method for fabricating an adjustable surface acoustic wave delay line.

In accordance with one embodiment of the present invention, a surface acoustic wave delay line is provided for adjusting the time delay or insertion phase of propagating surface acoustic wave energy in a device including spaced input and output transducers disposed on a substrate of piezoelectric material having a surface capable of supporting surface acoustic wave energy, the respective transducers being capable of launching propagating acoustic energy in response to an electrical signal and of detecting such propagating energy incident thereon and producing an electrical output signal. The invention also includes a compensation structure including a group of spaced conductive electrodes disposed on the substrate surface in the path of the propagating energy between the transducers and initially conductively interconnected outside the path of the propagating energy, any number of which electrodes may be electrically insulated from the others.

The electrodes of the compensation structure may be periodically or non-periodically spaced from each other, and are approximately orthogonally oriented with respect to the direction of the propagating energy.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawings, in which like reference characters refer to like elements in the several views.

BRIEF DESCRIPTION OF THE DRAWINGS

FIG. 3 is a schematic illustration of the compensation structure of FIG. 1 prior to an adjustment step insulating a number of electrodes from the summing bars;

FIG. 4 is a schematic illustration of a compensation structure in accordance with the present invention wherein only one end of the conductive elements is connected to a single summing bar;

FIG. 5 illustrates an embodiment of the present invention in which the compensation structure includes nonperiodically spaced electrodes;

FIGS. 7, 8 and 9 are enlarged views of compensation structures illustrating different ways in which a desired number of conductive electrodes may be electrically insulated from the other electrodes in order to obtain a desired time delay or insertion phase.

DESCRIPTION OF THE PREFERRED EMBODIMENTS

Figure 1:
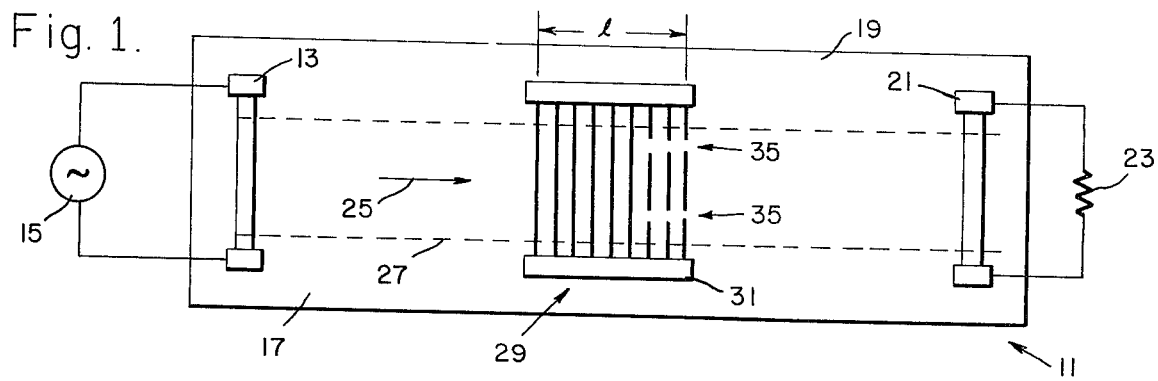
FIG. 1 is a schematic plan view of a surface acoustic wave delay line in accordance with an embodiment of the present invention.

Referring now to the drawings and more particularly to FIG. 1, there is shown a surface acoustic wave delay line 11 wherein a conventional interdigital input transducer 13 capable of launching propagating surface acoustic wave energy in response to an electrical input signal from a signal source 15 is disposed on a substrate 17 of piezoelectric material, such as for example LiNbO$_3$, having a surface 19 capable of propagating such energy. Also disposed on the substrate surface 19 is an output interdigital transducer 21 coupled to a load, which in this description is exemplified by a resistor 23.

Figure 2:
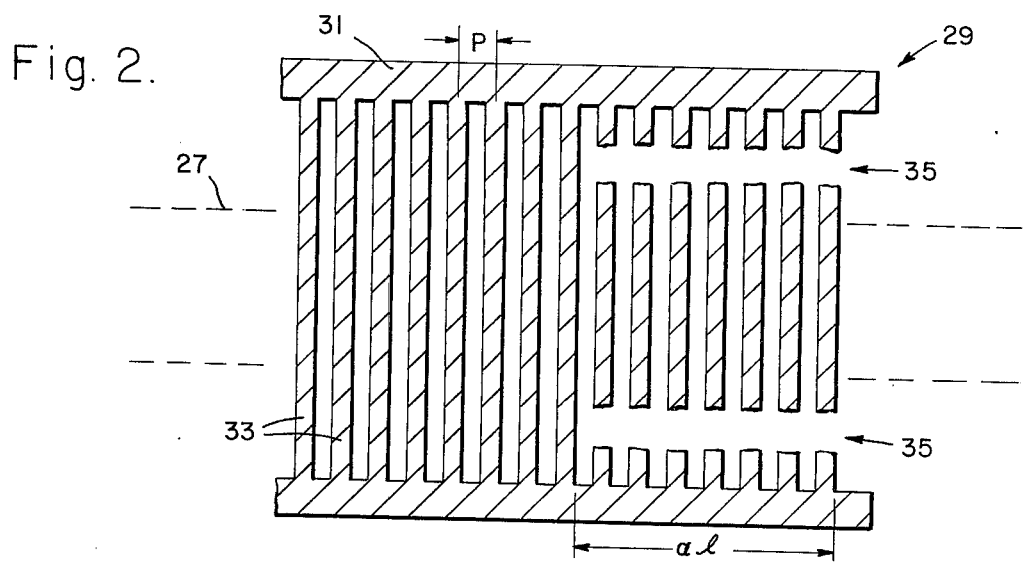
FIG. 2 is an enlarged view of the compensation structure in the delay line of FIG. 1.

The surface acoustic wave energy launched by the input transducer 13 and received by the output transducer 21 propagates in a direction indicated by arrow 25 and is essentially confined to a path defined in this illustration between dashed lines 27. Disposed on the surface 19 in the path 27 and generally intermediate the transducers is a unique compensation structure 29. As seen in FIG. 1 and more clearly in the enlarged view shown in FIG. 2, this structure may preferably take a form having a pair of conductive summing bars 31 in parallel spaced relationship both lying just outside the path 27. The structure 29 also includes a plurality or group of spaced conductive electrodes 33 orthogonal to and spanning the summing bars 31, all of the electrodes 33 being initially conductively interconnected (see FIG. 3) to the bars 31, normally as a unitary step of a deposition, etching or other conventional process generally applicable to that providing the interdigital transducers. In fact, the same conductive material, such as silver, gold etc., and the same step of the process may be used to deposit or otherwise produce both transducers and the compensation structure.

In accordance with this embodiment of the present invention, the metal electrodes 33 are periodically spaced and are associated with a summing bar 31 at both ends. However, in accordance with another embodiment of the invention, the invention may also be practiced by providing a compensation structure 29' utilizing only one summing bar 31' interconnecting only one end of the electrode 33, as illustrated in FIG. 4. Furthermore, a compensation structure 29'' may be utilized with non-periodically spaced electrodes 33' as in the embodiment shown in FIG. 5.

To understand the nature of the invention and its use in a delay line it should be understood that a conventional surface acoustic wave delay line consists of a pair of electroacoustic transducers, one the input and the other the output, usually deposited on the surface of a polished piezoelectric substrate such as LiNbO$_3$, for example. The time delay, T, for the delay line is given by $$T = d/v,$$

where $d$ is the transducer spacing and $v$ is the average velocity of the surface acoustic wave. Deviations from the nominal design values of both parameters produce time delay errors in a practical device which can be corrected or adjusted by the compensation structure 29 disposed in the path 27 between the transducers 13 and 21. Of course, it should be obvious that the structure 29 need only be in the propagation path to be effective, and where the path does not follow a straight line, then the structure need not lie directly between the transducers.

The wave velocity, $v_{sh}$, in the fully connected structure as shown in FIG. 3, for example, is slower than the velocity, $v_\infty$, on the unclad surface 19 by an amount which can be derived using a perturbational analysis such as described by K. M. Lakin in an article entitled "Perturbation Theory for Electromagnetic Coupling to Elastic Surface-Waves on Piezoelectric Substrates" in the Journal of Applied Physics, 1971, Volume 42, pages 899 through 906. This increases the time delay by an amount proportional to the velocity change and the length, $l$, of the fully shorted electrode compensation structure (FIG. 3). The variation in delay is accomplished by insulating a fraction, $\alpha$, of the electrodes (see FIGS. 1 and 2). The velocity, $v_{op}$ in the region with insulated electrodes is slower than $v_\infty$ but larger than $v_{sh}$. This reduces the time delay through the compensation structure by an amount proportional to $\alpha$.

The general expression for the net change in time delay due to the compensation structure is given by $$\Delta T = \frac{(1-\alpha)l}{v_{sh}} + \frac{\alpha l}{v_{op}} - \frac{l}{v_\infty},$$

where the first term expresses the time delay through the region with shorted electrodes, where the second term expresses the time delay through the region with insulated electrodes, and where the last term expresses the time delay for the distance, $l$, if the compensation structure were not present.

The general expression may be rearranged whereby $$\Delta T = \frac{l}{v_{sh}}\left(\frac{v_\infty - v_{sh}}{v_\infty}\right) - \frac{\alpha l}{v_{sh}}\left(\frac{v_{op} - v_{sh}}{v_{op}}\right),$$

where the first term expresses the change in time delay with all the electrodes shorted together by the summing bar or bars, while the second term expresses the reduction of time delay change due to insulating a fraction, $\alpha$, of the electrodes.

This expression can therefore be used to evaluate the maximum change in time delay, that is where $\alpha=0$, as well as the minimum change in time delay, that is where $\alpha=1$. The difference between these values is the maximum range in time delay adjustment possible when using the compensation structure of the invention for any given length, $l$. This range can be expressed as $$\Delta T_{max} - \Delta T_{min} = \frac{l}{v_{sh}}\left(\frac{v_{op} - v_{sh}}{v_{op}}\right).$$

Figure 6:
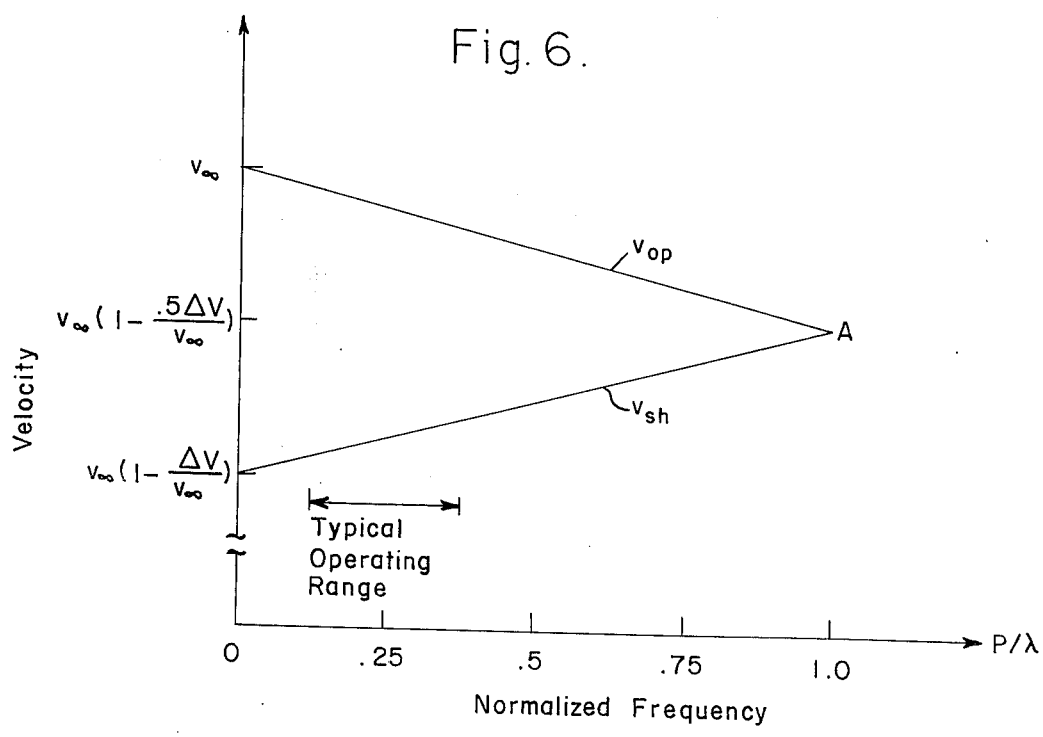
FIG. 6 is a graphical illustration showing the velocity changes that are possible, for a given element spacing, by adjustment of the compensation structure in the delay line of FIG. 1.

Referring now to FIG. 6, there is shown the relationship between $v_{op}$ and $v_{sh}$ vs. frequency for a compensation structure having periodically disposed electrodes. The normalized frequency variable in this figure relates the electrode centerline spacing, P, to frequency through the acoustic wavelength, $\lambda$, where $\lambda$ equals velocity divided by frequency.

Typically, operation of the compensation structure is chosen such that $0 < P/\lambda < 0.5$, and most often, operation is centered at a value of $P/\lambda = 0.25$, to take maximum advantage of acoustic reflection cancellation properties of electrodes spaced on quarter wavelength centers. The curve shown in FIG. 6 is for the case where the electrode width is equal to the gap dimensions. For wider electrodes and corresponding narrower gaps, the ordinant of the two curves, $v_{op}$, $v_{sh}$, remain fixed, while the apex, A, moves downward in velocity. $\Delta V$ in this graph is a characteristic of the piezoelectric substrate material indicating the change in velocity of the propagating surface wave that occurs when an electrical short circuit is imposed on the propagation surface of the substrate.

Finally, it is possible to determine the number of electrodes by considering that the expression for maximum change in time delay can be evaluated for the length dimension, $l$, such that $$l = \left(\Delta T_{max} - \Delta T_{min}\right) \left(\frac{v_{op} \cdot v_{sh}}{v_{op} - v_{sh}}\right),$$

where velocities $v_{op}$ and $v_{sh}$ are determined from FIG. 6 for the selected design value of $P/\lambda$. Now using the relationship of $l/P = N$, where N is the number of electrodes, N can be expressed as $$N = \left(\Delta T_{max} - \Delta T_{min}\right) \cdot \frac{f}{P/\lambda} \cdot \frac{v_{op} \cdot v_{sh}}{v_\infty(v_{op} - v_{sh})},$$

where f is the frequency of operation.

In providing a delay line constructed in accordance with the invention, the transducer spacing dimension, $d$, and compensation structure length, $l$, are chosen so that, for worst case tolerance buildups, the following conditions are satisfied:

1. with all electrodes 33 shorted, the delay is greater than the desired value, and
2. with all electrodes open (insulated from each other), the delay is less than the desired value. The desired variation in delay or insertion phase may be easily and accurately accomplished by scribing open a fraction ($\alpha$) of the electrodes 33. The preferred manner in which a desired characteristic may be obtained is to provide an input signal to the device and then make the aforementioned adjustment while monitoring the delay (or phase) at the output of the delay line incorporating the compensation structure. This is accomplished without disassembling the device.

In the embodiment shown in FIG. 1, the elements 33 at downstream end of the structure 29 have been scribed or otherwise insulated from the summing bar 31 as indicated by arrows 35. However, it should be understood that any of the initially shorted elements in the compensation structure 29 may be insulated from the remaining shorted elements in practicing the invention. For example, a number of elements 33 may be scribed open at both the upstream and downstream ends of the structure as shown in FIG. 7. Also, only the upstream elements may be dealt with, as in the version seen in FIG. 8, or only elements intermediate the ends of the structure may be opened as illustrated in FIG. 9. In fact, any combination of these procedures may be utilized.

It should be evident from the foregoing that a novel and advantageous surface acoustic wave delay line has been described that makes it possible to compensate for such factors as crystal orientation tolerances with a straightforward adjustment as the final step in the fabrication process.

Furthermore, it should be understood that the materials and processes described in fabricating the described embodiments of the invention are not critical and any material and process exhibiting similar desirable characteristics and structures may be substituted for those mentioned.

Although the present invention has been shown and described with reference to particular embodiments, nevertheless various changes, modifications and embodiments which are obvious to persons skilled in the art to which the invention pertains are deemed to lie within the spirit, scope and contemplation of the invention.

What is claimed is:

1. A surface acoustic wave delay line for adjusting the time delay or insertion phase of propagating surface acoustic wave energy, comprising:
   a substrate of piezoelectric material having a surface capable of propagating surface acoustic wave energy;
   input means including an input transducer disposed on said substrate for launching surface acoustic wave energy along said surface in response to an electrical input signal;
   output means including an output transducer disposed on said substrate in the path of said propagating energy for detecting said energy incident thereon and producing an electrical output signal; and
   time delay or phase compensation means disposed on said substrate in the path of said propagating energy between said transducers, said means including a group of spaced conductive electrodes initially conductively interconnected outside said path of said propagating energy, at least one of said electrodes being electrically insulated from the remainder of said group of electrodes.

2. The delay line according to claim 1, wherein said electrodes are periodically spaced.

3. The delay line according to claim 1, wherein said electrodes are non-periodically spaced.

4. The delay line according to claim 1, wherein said electrodes are approximately orthogonally oriented with respect to the direction of said propagating energy.

5. The delay line according to claim 1, wherein said electrodes are initially conductively interconnected by a conductive summing bar disposed at one end of said electrodes.

6. The delay line according to claim 1, wherein said electrodes are initially conductively interconnected by a conductive summing bar disposed at each end of said electrodes.

7. In a surface acoustic wave delay line including spaced input and output transducers disposed on a propagating surface of a piezoelectric substrate, the improvement comprising time delay or phase compensation means disposed on the substrate of piezoelectric material in the path of surface acoustic wave energy propagating between the input and output transducers, the means including a group of spaced conductive electrodes initially conductively interconnected outside the path of the propagating energy, at least one of said electrodes being electrically insulated from the remainder of the conductively interconnected group of said electrodes.

8. A method of manufacturing a surface acoustic wave delay line on a piezoelectric substrate comprising the steps of depositing spaced interdigital input and output transducers defining a propagating path therebetween and a group of spaced conductive electrodes conductively interconnected outside said path, and selectively severing at least one of said conductively interconnected conductive electrodes outside said path to provide a desired characteristic related to time delay or phase.

* * * * *